United States Patent
Tanaka (10) Patent No.: US 12,407,318 B2
(45) Date of Patent: Sep. 2, 2025

(54) FILTER DEVICE AND HIGH-FREQUENCY FRONT END CIRCUIT HAVING SAME MOUNTED THEREON

(71) Applicant: Murata Manufacturing Co., Ltd., Nagaokakyo (JP)

(72) Inventor: Akira Tanaka, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 290 days.

(21) Appl. No.: 18/127,149

(22) Filed: Mar. 28, 2023

(65) Prior Publication Data
US 2023/0238936 A1 Jul. 27, 2023

Related U.S. Application Data

(63) Continuation of application No. PCT/JP2021/038908, filed on Oct. 21, 2021.

(30) Foreign Application Priority Data

Nov. 6, 2020 (JP) .................................. 2020-185900

(51) Int. Cl.
*H03K 7/00* (2006.01)
*H03H 7/01* (2006.01)
(Continued)

(52) U.S. Cl.
CPC ............ *H03H 7/12* (2013.01); *H03H 7/1758* (2013.01); *H03H 2001/0085* (2013.01)

(58) Field of Classification Search
CPC .......... H03H 7/00; H03H 7/01; H03H 7/0107; H03H 7/0115; H03H 7/09; H03H 7/12;
(Continued)

(56) References Cited

U.S. PATENT DOCUMENTS 11,190,161 B2 * 11/2021 Tanaka ................. H03H 7/1766
2017/0126198 A1 5/2017 Mukai
(Continued)

FOREIGN PATENT DOCUMENTS

| JP | H1140920 A | 2/1999 |
|----|-----------|--------|
| JP | 2017092546 A | 5/2017 |

(Continued)

OTHER PUBLICATIONS

International Search Report in PCT/JP2021/038908, mailed Nov. 30, 2021, 3 pages.
(Continued)

*Primary Examiner* — Hai L Nguyen (74) *Attorney, Agent, or Firm* — Keating & Bennett, LLP (57) ABSTRACT

A filter includes a body and first and second filters with pass bands different from each other. In the body, an inductor of the first filter is in a first range, and an inductor of the second filter is in a second range. The inductor in the first filter is a vertical coil including a plate electrode and a via extending in a normal direction of the body. In the second filter, the inductor facing the first range is a planar coil with a winding axis in the normal direction of the body. As seen in plan view in the normal direction of the body, an imaginary line from an extending-direction center of the plate electrode of the first filter in a direction perpendicular or substantially perpendicular to the extending direction does not intersect with the inductor of the second filter.

20 Claims, 7 Drawing Sheets

(51) Int. Cl.
*H03H 7/12* (2006.01)
*H03H 1/00* (2006.01)

(58) Field of Classification Search
CPC .... H03H 7/175; H03H 7/1758; H03H 7/1783; H03H 7/1791
USPC ................................ 333/165, 166, 167, 185
See application file for complete search history.

(56) References Cited

U.S. PATENT DOCUMENTS

2017/0187345 A1   6/2017   Yun et al.
2021/0036676 A1   2/2021   Tanaka

FOREIGN PATENT DOCUMENTS

JP   2019507972 A   3/2019
JP   2021027369 A   2/2021

OTHER PUBLICATIONS

Written Opinion in PCT/JP2021/038908, mailed Nov. 30, 2021, 5 pages.

* cited by examiner

FILTER DEVICE AND HIGH-FREQUENCY FRONT END CIRCUIT HAVING SAME MOUNTED THEREON

CROSS REFERENCE TO RELATED APPLICATIONS

This application claims the benefit of priority to Japanese Patent Application No. 2020-185900 filed on Nov. 6, 2020 and is a Continuation Application of PCT Application No. PCT/JP2021/038908 filed on Oct. 21, 2021. The entire contents of each application are hereby incorporated herein by reference.

BACKGROUND OF THE INVENTION

1. Field of the Invention

The present disclosure relates to a filter device and a high-frequency front end circuit including the filter device, and specifically relates to techniques to improve bandpass characteristics of a diplexer including two LC filters.

2. Description of the Related Art

Japanese Unexamined Patent Application Publication No. 2019-507972 discloses a multiplexer including a high band filter and a low band filter including an LC circuit. In the multiplexer disclosed in Japanese Unexamined Patent Application Publication No. 2019-507972, an inductor of the high band filter is configured as a 2D spiral inductor provided to a surface of a substrate, and an inductor of the low band filter is configured as a 3D inductor provided to an internal layer of the substrate.

Further, Japanese Unexamined Patent Application Publication No. 11-40920 discloses a configuration in which, in a compound component made of a plurality of integrated inductors, the inductors are disposed such that magnetic fluxes generated by the adjacent inductors become substantially perpendicular or substantially perpendicular to each other.

SUMMARY OF THE INVENTION

However, in the configurations disclosed in Japanese Unexamined Patent Application Publication and Japanese Unexamined Patent Application Publication No. 11-40920, in the inductors included in the respective filters disposed adjacent to each other, a magnetic flux penetrating an air core diameter of one inductor interferes with the other inductor. Therefore, magnetic coupling between the two inductors may be caused.

In a filter device (diplexer, multiplexer) including a plurality of LC filters, when inductors of different filters magnetically couple to each other, a Q factor may decrease and/or isolation may deteriorate, which may lead to deterioration in filter characteristics.

Preferred embodiments of the present invention each reduce or prevent deterioration in filter characteristics in filter devices including LC filters.

A filter device according to a first aspect of an example embodiment of the present disclosure includes a body, a first filter with a first pass band, and a second filter with a second pass band different from the first pass band. As seen in plan view in a normal direction of the body, an inductor included in the first filter is in a first range, and an inductor included in the second filter is in a second range adjacent to the first range. Each of the first filter and the second filter includes at least one inductor. The at least one inductor included in the first filter is a vertical coil which includes a plate electrode and a via extending in the normal direction of the body. In the second filter, the at least one inductor facing the first range is a planar coil with a winding axis extending in the normal direction of the body. As seen in plan view in the normal direction of the body, an imaginary line does not intersect with the at least one inductor included in the second filter, the imaginary line being drawn from an extending-direction center of the plate electrode of the first filter in a direction perpendicular or substantially perpendicular to the extending direction.

A filter device according to a second aspect of an example embodiment of the present disclosure includes a body, a first filter with a first pass band, and a second filter with a second pass band different from the first pass band. Each of the first filter and the second filter includes at least one inductor. As seen in plan view in a normal direction of the body, the at least one inductor included in the first filter is in a first range, and the at least one inductor included in the second filter is in a second range adjacent to the first range. The at least one inductor included in the first filter is a vertical coil which includes a plate electrode and a via extending in the normal direction of the body. In the second filter, the at least one inductor facing the first range includes a vertical coil and a planar coil with a winding axis extending in the normal direction of the body. A distance between the vertical coil of the second filter and the first range is longer than a distance between the planar coil and the first range. As seen in plan view in the normal direction of the body, (i) a first imaginary line does not intersect with the at least one inductor included in the second filter, the first imaginary line being drawn from an extending-direction center of the plate electrode of the first filter in a direction perpendicular or substantially perpendicular to the extending direction, and (ii) a second imaginary line does not intersect with the at least one inductor included in the first filter, the second imaginary line being drawn from an extending-direction center of the plate electrode of the second filter in a direction perpendicular or substantially perpendicular to the extending direction.

In a filter device according to an example embodiment of the present disclosure, the two filters (first filter, second filter) are within the respective ranges adjacent to each other in the body. The at least one inductor of the first filter is the vertical coil including the plate electrode and the via. In the second filter, the at least one inductor facing the first filter is the planar coil. The imaginary line drawn from the extending-direction center of the plate electrode of the first filter in the direction perpendicular or substantially perpendicular to the extending direction does not intersect with the at least one inductor included in the second filter. In this configuration, a magnetic field caused by an inductor of one filter is prevented from interfering with an inductor of the other filter, thus magnetic coupling between the inductors is reduced or prevented. As a result, deterioration in filter characteristics can be reduced or prevented.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinbelow, preferred embodiments of the present disclosure will be described in detail with reference to the drawings. Note that identical or corresponding portions in the drawings are provided with identical reference characters and description thereof is not repeated.

Preferred Embodiment 1

Basic Configuration of Communication Device

Figure 1:
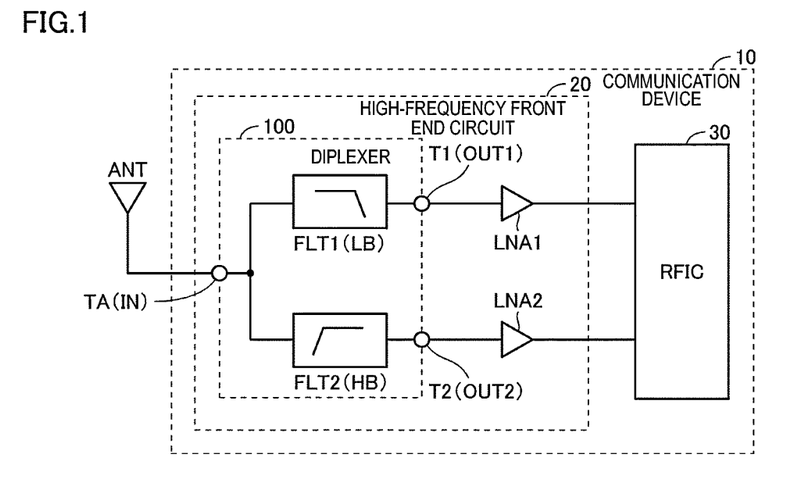
FIG. 1 is a block diagram of a communication device including a high-frequency front end circuit to which a filter device according to Preferred Embodiment 1 of the present invention is applied.

FIG. 1 is a block diagram of a communication device 10 including a high-frequency front end circuit 20 to which a filter device 100 according to this preferred embodiment is applied. The high-frequency front end circuit 20 separates high-frequency signals received by an antenna device ANT into a plurality of given frequency bands to be transmitted to a subsequent processing circuit. The high-frequency front end circuit 20 is used for, for example, a mobile terminal (for example, a cellular phone, a smartphone, or a tablet) and a communication device (for example, a personal computer with a communication function).

With reference to FIG. 1, the communication device 10 includes the high-frequency front end circuit 20 having the filter device 100 and an RF signal processing circuit (hereinafter, may be referred to as an "RFIC") 30. The high-frequency front end circuit 20 illustrated in FIG. 1 is a reception front end circuit. The high-frequency front end circuit 20 includes the filter device 100 and amplifier circuits LNA1 and LNA2.

The filter device 100 is a diplexer including a filter FLT1 (first filter) and a filter FLT2 (second filter) having pass bands in frequency ranges different from each other. In the following description, the filter device 100 may be referred to as a "diplexer".

The filter FLT1 is connected between an antenna terminal TA which is a common terminal and a first terminal T1. The filter FLT1 is a low pass filter whose pass band is a frequency range of a low band (LB) group and whose non-pass band is a frequency range of a high band (HB) group. The filter FLT2 is connected between the antenna terminal TA and a second terminal T2. The filter FLT2 is a high pass filter whose pass band is a frequency range of a high band group and whose non-pass band is a frequency range of a low band group. Note that the filter FLT1 and the filter FLT2 may be a band pass filter.

Each of the filters FLT1 and FLT2 allows only high-frequency signals corresponding to the pass band of the filter to pass among high-frequency signals received by the antenna device ANT. As a result, the signals received from the antenna device ANT are separated into signals in a plurality of given frequency bands.

Each of the amplifier circuits LNA1 and LNA2 is a so-called low noise amplifier. The amplifier circuits LNA1 and LNA2 amplify, while having low noise, the high-frequency signals which passed the corresponding filters, and transmit the signals to the RFIC 30.

The RFIC 30 is an RF signal processing circuit which processes the high-frequency signals transmitted or received by the antenna device ANT. Specifically, the RFIC 30 performs signal processing (for example, down-conversion) to the high-frequency signals inputted from the antenna device ANT through a reception signal path of the high-frequency front end circuit 20, and outputs the reception signals generated through the signal processing to a baseband signal processing circuit (not illustrated).

When the high-frequency front end circuit 20 is used as the reception circuit as illustrated in FIG. 1, in the filter device 100, the antenna terminal TA becomes an input terminal IN, and the first terminal T1 and the second terminal T2 respectively become a first output terminal OUT1 and a second output terminal OUT2. On the other hand, the high-frequency front end circuit may be used as a transmission circuit. In this case, each of the first terminal T1 and the second terminal T2 of the filter device 100 becomes an input terminal, and the antenna terminal TA becomes a common output terminal. In such a case, a power amplifier is used as an amplifier included in the amplifier circuit.

Configuration of Filter Device

Figure 2:
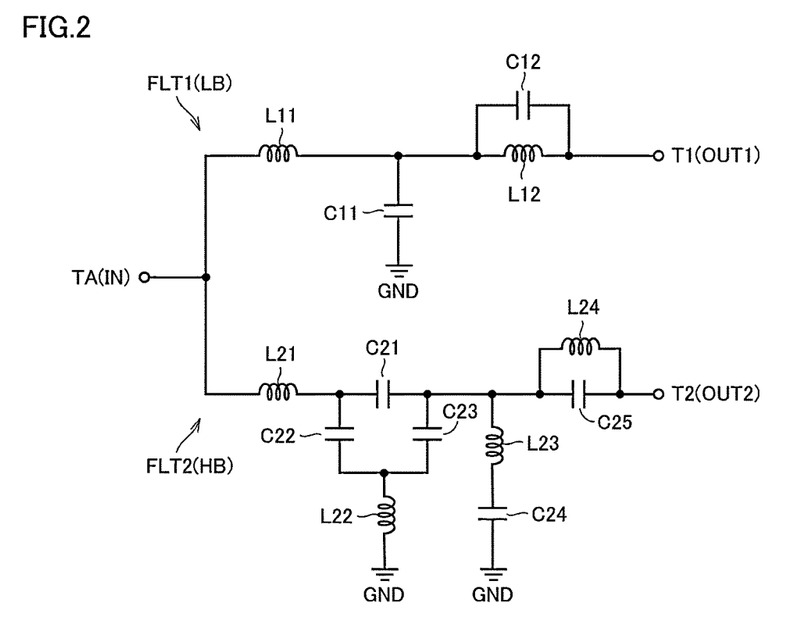
FIG. 2 is an equivalent circuit diagram of the filter device according to Preferred Embodiment 1 of the present invention.

FIG. 2 is a diagram illustrating an equivalent circuit of one example of the filter device (diplexer) 100 in FIG. 1. As illustrated in FIG. 1, the filter FLT1 is connected between the antenna terminal TA and the first terminal T1. Further, the filter FLT2 is connected between the antenna terminal TA and the second terminal T2.

The filter FLT1 includes inductors L11 and L12 and a capacitor C12 which define a serial arm circuit, and a capacitor C11 which defines a parallel arm circuit. The inductor L11 is connected to the antenna terminal TA, and the inductor L12 is connected between the inductor L11 and the first terminal T1. That is, the inductors L11 and L12 are connected in series between the antenna terminal TA and the first terminal T1. The capacitor C11 is connected between a ground terminal GND and a connection node between the inductors L11 and L12. The capacitor C12 is connected to the inductor L12 in parallel. In this configuration, the filter FLT1 functions as the low pass filter which passes signals in a frequency band lower than a given frequency.

The filter FLT2 includes inductors L21 and L24 and capacitors C21 and C25 which define a serial arm circuit, and inductors L22 and L23 and capacitors C22 to C24 which define a parallel arm circuit. One end of the inductor L21 is connected to the antenna terminal TA, and the other end of the inductor L21 is connected to one end of the capacitor C21. The capacitor C25 is connected between the other end of the capacitor C21 and the second terminal T2. The inductor L24 is connected to the capacitor C25 in parallel.

One end of the capacitor C22 is connected to a connection node between the inductor L21 and the capacitor C21. The other end of the capacitor C22 is connected to a ground terminal GND with the inductor L22 interposed therebetween. One end of the capacitor C23 is connected to a connection node between the capacitor C21 and the capacitor C25. The other end of the capacitor C23 is connected to the ground terminal GND with the inductor L22 interposed therebetween.

One end of the inductor L23 is connected to a connection node between the capacitor C21 and the capacitor C25. The other end of the inductor L23 is connected to a ground terminal GND with the capacitor C24 interposed therebetween.

The filter FLT2 functions as a band pass filter by the inductor L21 for trap, an LC resonator including the inductor L22 and the capacitors C21 to C23, a resonator including the inductor L23 and the capacitor C24, and a resonator including the inductor L24 and the capacitor C25.

Note that, in the example of the filter device 100 in Preferred Embodiment 1, the pass band of the filter FLT1 is set to approximately 0 to 960 MHz, and the pass band of the filter FLT2 is set to approximately 1427 MHz to 2690 MHz, for example. Therefore, in the filter device 100, the filter FLT2 functions as a high pass filter.

Figure 3:
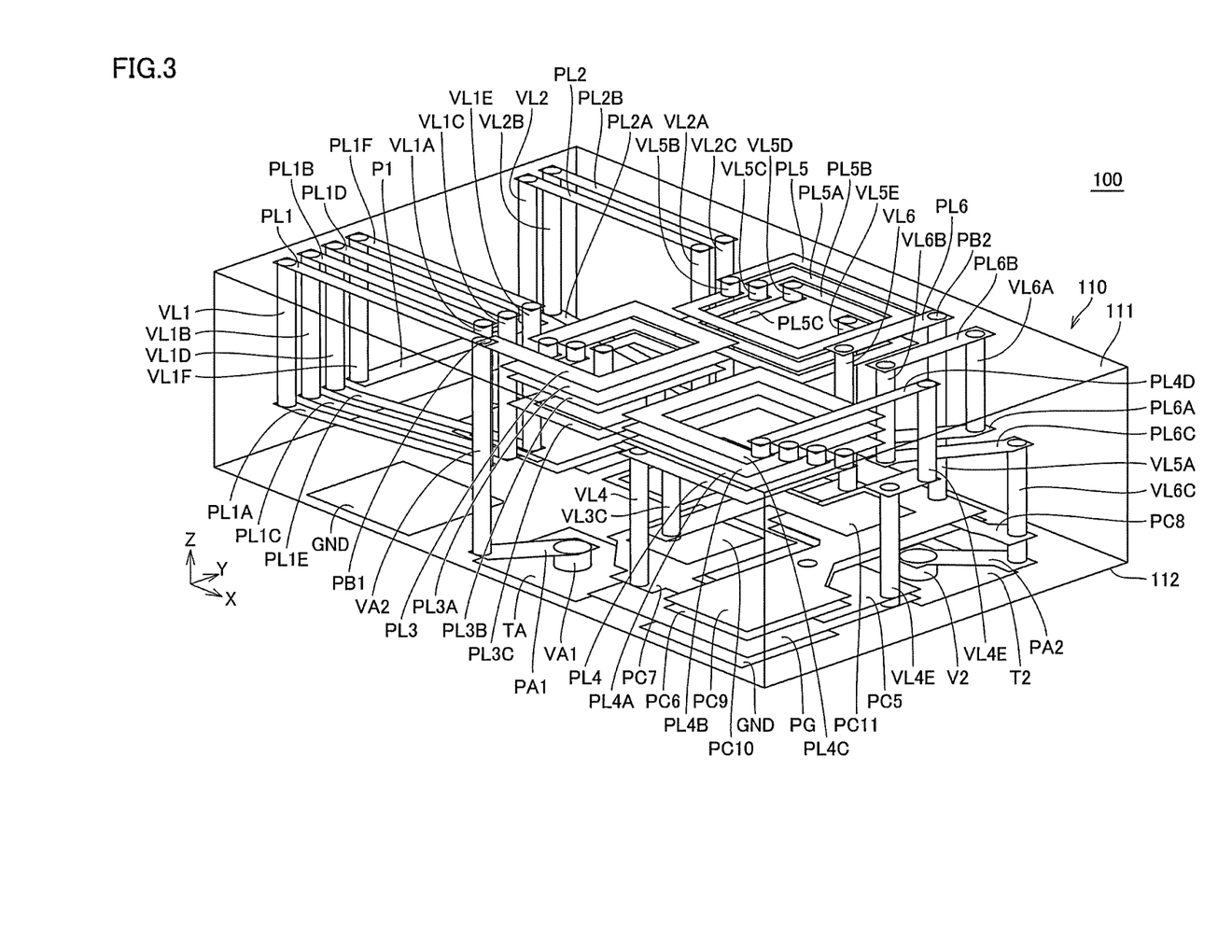
FIG. 3 is a perspective view illustrating inside of the filter device in FIG. 2.
Figure 4:
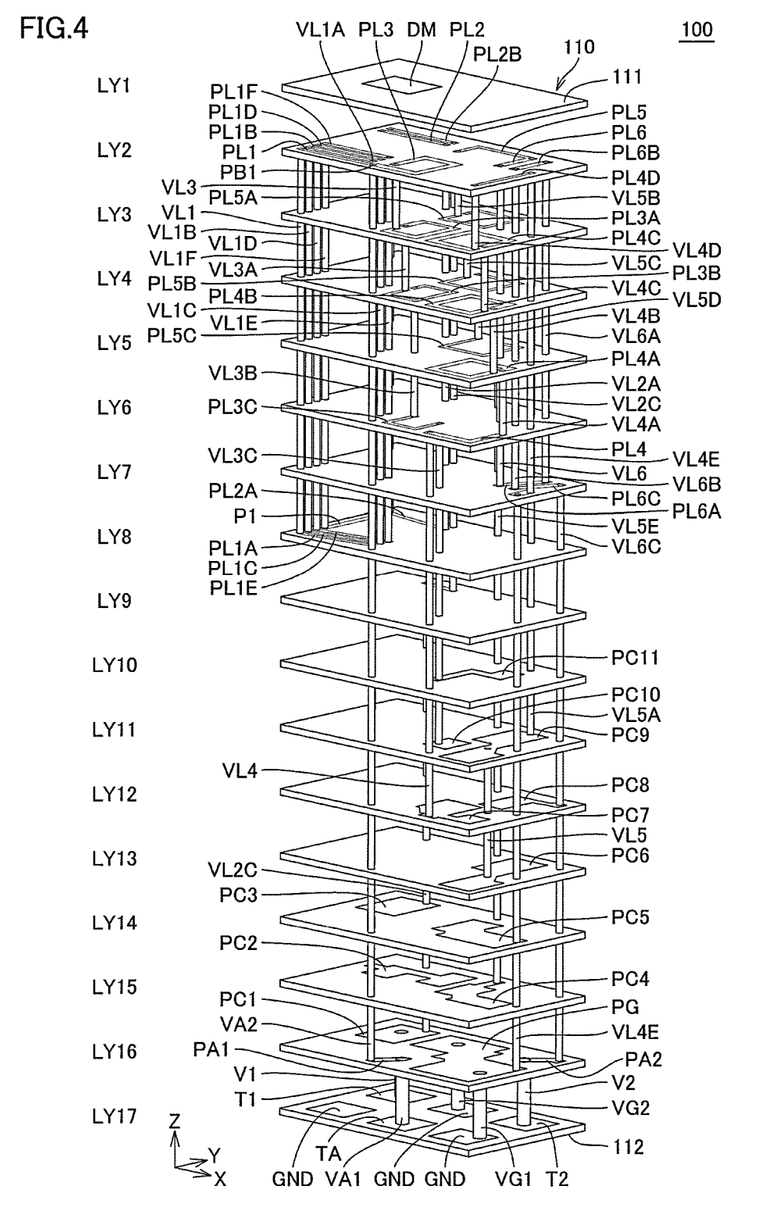
FIG. 4 is an exploded perspective view illustrating one example of a multilayer structure of the filter device in FIG. 2.
Figure 5:
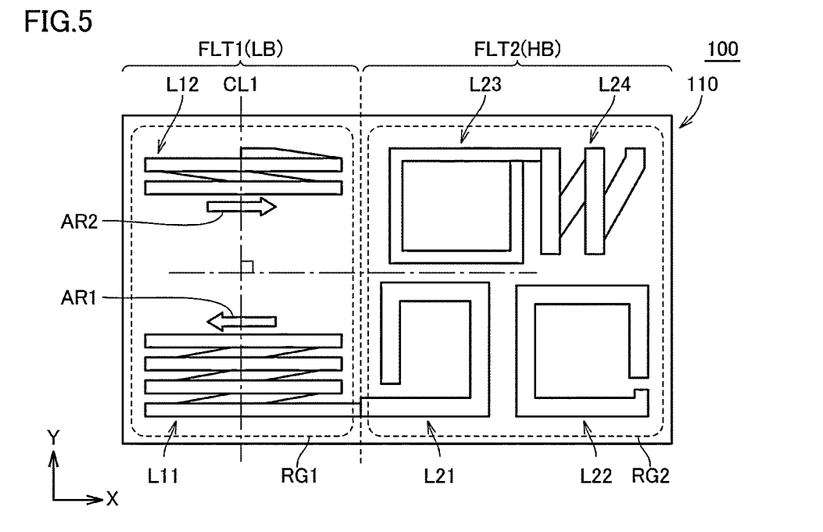
FIG. 5 is a diagram illustrating layout of inductors in the filter device in FIG. 2.

Next, details of internal configuration of the filter device 100 are described with reference to FIGS. 3 to 5. FIG. 3 is a perspective view illustrating inside of the filter device 100 in FIG. 2. FIG. 4 is an exploded perspective view illustrating one example of a multilayer structure of the filter device 100. Further, FIG. 5 is a diagram illustrating layout of the inductors in the filter device 100. Specifically, FIG. 5 is a plan view where dielectric layers LY2 to LY8 in FIG. 4 are overlapped with each other.

With reference to FIGS. 3 and 4, the filter device 100 includes a body 110 in a rectangular parallelepiped shape or a substantially rectangular parallelepiped shape, including a plurality of dielectric layers LY1 to LY17 laminated in a given direction. In the body 110, the direction in which the plurality of dielectric layers LY1 to LY17 are laminated is referred to as a layered direction. Each dielectric layer of the body 110 is formed, for example, by ceramics such as low temperature co-fired ceramics (LTCC) or a resin. Inside the body 110, the inductors and the capacitors which define the filters FLT1 and FLT2 are including a plurality of electrodes provided to the respective dielectric layers and a plurality of vias provided between the dielectric layers. Note that, in FIGS. 3 to 5, the dielectric of the body 110 is omitted, and only wiring patterns, vias, and conductors of terminals provided inside the body 110 are illustrated. The term "via" as used herein indicates a conductor formed inside the dielectric layer to connect electrodes provided to the different dielectric layers. The via is formed by, for example, conductive paste, plating, and/or a metallic pin.

In the following description, the layered direction of the body 110 is referred to as a "Z-axis direction", a direction vertical to the Z-axis direction and along a long side of the body 110 is referred to as an "X-axis direction", and a direction along a short side of the body 110 is referred to as a "Y-axis direction". Moreover, a positive direction of the Z axis in each drawing may be referred to below as an upper side, and a negative direction may be referred to below as a lower side.

A first principal surface 111 (dielectric layer LY1) of the body 110 is provided with a directional mark DM to identify the direction of the filter device 100. A second principal surface 112 (dielectric layer LY17) of the body 110 is provided with the antenna terminal TA, the first terminal T1, the second terminal T2, and the ground terminals GND which are outer terminals to connect the filter device 100 to an external device. Each outer terminal is a plate-shaped electrode, and is a land grid array (LGA) terminal disposed regularly on the second principal surface 112 of the body 110. In the example illustrated in FIGS. 3 and 4, schematically, the filter FLT1 on the low band side is provided to a left side (X-axis negative direction) portion of the body 110, and the filter FLT2 on the high band side is provided to a right side (X-axis positive direction) portion.

The antenna terminal TA provided to the second principal surface 112 (dielectric layer LY17) is connected to a branch point PB1 in the dielectric layer LY2, with vias VA1 and VA2 and a plate electrode PA1 interposed therebetween. The branch point PB1 is a branching point between the filter FLT1 and the filter FLT2. The vias VA1 and VA2 are offset from each other by the plate electrode PA1 provided to the dielectric layer LY16.

First, details of the filter FLT1 which is a low pass filter are described. A linear-shaped plate electrode PL1 extending in the X-axis negative direction from the branch point PB1 is connected to the branch point PB1. The plate electrode PL1 is connected at one end portion to a via VL1. The plate electrode PL1 is connected to one end of a band-shaped plate electrode PL1A provided to the dielectric layer LY8, with the via VL1 interposed therebetween. The plate electrode PL1A is connected at the other end to a via VL1A. The plate electrode PL1A is connected to one end of a linear-shaped plate electrode PL1B provided to the dielectric layer LY2, with the via VL1A interposed therebetween. The plate electrode PL1B extends in the X-axis direction in the dielectric layer LY2, and is connected at the other end to a via VL1B. The plate electrode PL1B is connected to one end of a band-shaped plate electrode PL1C provided to the dielectric layer LY8, with the via VL1B interposed therebetween.

The plate electrode PL1C is connected at the other end to a via VL1C. The plate electrode PL1C is connected to one end of a linear-shaped plate electrode PL1D provided to the dielectric layer LY2, with the via VL1C interposed therebetween. The plate electrode PL1D extends in the X-axis direction in the dielectric layer LY2, and is connected at the other end to a via VL1D. The plate electrode PL1D is connected to one end of a band-shaped plate electrode PL1E provided to the dielectric layer LY8, with the via VL1D interposed therebetween.

The plate electrode PL1E is connected at the other end to a via VL1E. The plate electrode PL1E is connected to one end of a linear-shaped plate electrode PL1F provided to the dielectric layer LY2, with the via VL1E interposed therebetween. The plate electrode PL1F extends in the X-axis direction in the dielectric layer LY2, and is connected at the other end to a via VL1F. The plate electrode PL1F is connected to one end of a linear-shaped plate electrode P1 provided to the dielectric layer LY8, with the via VL1F interposed therebetween. The plate electrodes PA1 and PL1 to PL1F and the vias VA1, VA2, and VL1 to VL1F define the inductor L11 in FIG. 2.

The plate electrode P1 extends in the Y-axis direction in the dielectric layer LY8, and is connected at the other end to a via VL2. The plate electrode P1 is connected to one end of a linear-shaped plate electrode PL2 provided to the dielectric layer LY2, with the via VL2 interposed therebetween. The plate electrode PL2 extends in the X-axis direction in the dielectric layer LY2, and is connected at the other end to a via VL2A. The plate electrode PL2 is connected to one end of a linear-shaped plate electrode PL2A provided to the dielectric layer LY8, with the via VL2A interposed therebetween.

The plate electrode PL2A is connected at the other end to a via VL2B. The plate electrode PL2A is connected to one end of a linear-shaped plate electrode PL2B provided to the dielectric layer LY2, with the via VL2B interposed therebetween. The plate electrode PL2B extends in the X-axis direction in the dielectric layer LY2, and is connected at the other end to a via VL2C. The plate electrode PL2B is connected to a capacitor electrode PC1 provided to the dielectric layer LY16 and a capacitor electrode PC3 provided to the dielectric layer LY14, with the via VL2C interposed therebetween. Note that the via VL2C offsets in the dielectric layer LY9. The capacitor electrode PC1 is connected to the first terminal T1 by a via V1. The plate electrodes PL2 to PL2B, the vias VL2 to VL2C and V1, and the capacitor electrode PC1 define the inductor L12 in FIG. 2.

When the body 110 is seen in plan view in the layered direction, each of the capacitor electrodes PC1 and PC3 is disposed to partially overlap with a capacitor electrode PC2 provided to the dielectric layer LY15. A combined capacitance of a capacitor including the capacitor electrode PC1 and the capacitor electrode PC2 and a capacitor including the capacitor electrode PC2 and the capacitor electrode PC3 defines the capacitor C12 in FIG. 2.

Further, a portion of the capacitor electrode PC2 has a shape overlapping also with a plate electrode PG provided to the dielectric layer LY16 when the body 110 is seen in plan view in the layered direction. The plate electrode PG is connected to the ground terminal GND by vias VG1 and VG2. Therefore, the capacitor electrode PC2 and the plate electrode PG define the capacitor C11 in FIG. 2.

Next, details of the filter FLT2 which is a high pass filter are described. One end of a band-shaped plate electrode PL3 wound about the axis (Z axis) of the layered direction of the body 110 is connected to the branch point PB1. The plate electrode PL3 is connected at the other end to a via VL3. The plate electrode PL3 is connected to one end of a band-shaped plate electrode PL3A provided to the dielectric layer LY3, with the via VL3 interposed therebetween.

The plate electrode PL3A is also an electrode wound about the Z axis similarly to the plate electrode PL3, and is connected at the other end to a via VL3A. The plate electrode PL3A is connected to one end of a band-shaped plate electrode PL3B provided to the dielectric layer LY4, with the via VL3A interposed therebetween. The plate electrode PL3B is also an electrode wound about the Z axis similarly to the plate electrode PL3 or the like, and is connected at the other end to a via VL3B. The plate electrode PL3B is connected to one end of a band-shaped plate electrode PL3C provided to the dielectric layer LY6, with the via VL3B interposed therebetween.

The plate electrode PL3C has a substantially C-shape, and is connected at the other end to a via VL3C. The via VL3C is connected to a capacitor electrode PC11 provided to the dielectric layer LY10, and a capacitor electrode PC10 provided to the dielectric layer LY11. The plate electrodes PA1 and PL3 to PL3C and the vias VA1, VA2, and VL3 to VL3C define the inductor L21 in FIG. 2.

When the body 110 is seen in plan view in the layered direction, the capacitor electrode PC10 is disposed to partially overlap with a capacitor electrode PC7 provided to the dielectric layer LY12. The capacitor electrodes PC7 and PC10 define the capacitor C22 in FIG. 2.

The capacitor electrode PC7 is connected to one end of a band-shaped plate electrode PL4 provided to the dielectric layer LY6, with a via VL4 interposed therebetween. The plate electrode PL4 is L-shaped or substantially L-shaped, and is connected at the other end to a via VL4A. The plate electrode PL4 is connected to one end of a band-shaped plate electrode PL4A provided to the dielectric layer LY5, with the via VL4A interposed therebetween. The plate electrode PL4A is an electrode wound about the Z axis, and is connected at the other end to a via VL4B. The plate electrode PL4A is connected to one end of a band-shaped plate electrode PL4B provided to the dielectric layer LY4, with the via VL4B interposed therebetween.

The plate electrode PL4B is also an electrode wound about the Z axis, and is connected at the other end to a via VL4C. The plate electrode PL4B is connected to one end of a band-shaped plate electrode PL4C provided to the dielectric layer LY3, with the via VL4C interposed therebetween. The plate electrode PL4C is also an electrode wound about the Z axis, and is connected at the other end to a via VL4D. The plate electrode PL4C is connected to one end of a linear-shaped plate electrode PL4D provided to the dielectric layer LY2, with the via VL4D interposed therebetween.

The plate electrode PL4D extends in the Y-axis direction, and is connected at the other end to a via VL4E. The via VL4E offsets in the dielectric layer LY7, and is connected to a capacitor electrode PC5 provided to the dielectric layer LY14 and the plate electrode PG provided to the dielectric layer LY16. As described above, the plate electrode PG is connected to the ground terminal GND provided to the dielectric layer LY17. Therefore, the plate electrodes PG and PL4 to PL4D and the vias VG1, VG2, and VL4 to VL4E define the inductor L22 in FIG. 2.

A portion of the capacitor electrode PC5 is disposed to overlap with a capacitor electrode PC6 provided to the dielectric layer LY13 when the body 110 is seen in plan view in the layered direction. The capacitor electrode PC5 and the capacitor electrode PC6 define the capacitor C23 in FIG. 2.

The capacitor electrode PC6 is connected to a capacitor electrode PC9 provided to the dielectric layer LY11 by a via VL5. When the body 110 is seen in plan view in the layered direction, each of the capacitor electrodes PC6 and PC9 is disposed to partially overlap with capacitor electrodes PC7 and PC8 provided to the dielectric layer LY12. The capacitor electrodes PC6 and PC9 and the capacitor electrode PC7 define the capacitor C21 in FIG. 2. Moreover, the capacitor electrodes PC6 and PC9 and the capacitor electrode PC8 define the capacitor C25 in FIG. 2.

The capacitor electrode PC9 is connected to band-shaped plate electrodes PL5 and PL6 at a branch point PB2 in the dielectric layer LY2, with a via VL5A interposed therebetween. The plate electrode PL5 is L-shaped or substantially L-shaped. The plate electrode PL5 is connected at an end portion opposite from the branch point PB2 to a via VL5B. The plate electrode PL5 is connected to one end of a band-shaped plate electrode PL5A provided to the dielectric layer LY3, with the via VL5B interposed therebetween.

The plate electrode PL5A is an electrode wound about the Z axis, and is connected at the other end to a via VL5C. The plate electrode PL5A is connected to one end of a band-shaped plate electrode PL5B provided to the dielectric layer LY4, with the via VL5C interposed therebetween.

The plate electrode PL5B is also an electrode wound about the Z axis similarly to the plate electrode PL5A, and is connected at the other end to a via VL5D. The plate electrode PL5B is connected to one end of a band-shaped plate electrode PL5C provided to the dielectric layer LY5, with the via VL5D interposed therebetween. The plate electrode PL5C is also an electrode wound about the Z axis similarly to the plate electrode PL5A or the like, and is connected at the other end to a via VL5E. The plate electrode PL5C is connected to a capacitor electrode PC4 provided to the dielectric layer LY15, with the via VL5E interposed therebetween. The plate electrodes PL5 to PL5C, the capacitor electrode PC9, and the vias VL5 to VL5E define the inductor L23 in FIG. 2.

When the body 110 is seen in plan view in the layered direction, a portion of the capacitor electrode PC4 overlaps with the plate electrode PG provided to the dielectric layer LY16. The capacitor electrode PC4 and the plate electrode PG define the capacitor C24 in FIG. 2.

The plate electrode PL6 is a linear-shaped electrode extending in the Y-axis direction from the branch point PB2 in the dielectric layer LY2. The plate electrode PL6 is connected at an end portion opposite from the branch point PB2 to a via VL6. The plate electrode PL6 is connected to one end of a band-shaped plate electrode PL6A provided to the dielectric layer LY7, with the via VL6 interposed therebetween. The plate electrode PL6A is connected at the other end to a via VL6A. The plate electrode PL6A is connected to one end of a plate electrode PL6B provided to the dielectric layer LY2, with the via VL6A interposed therebetween.

The plate electrode PL6B is a linear-shaped electrode extending in the Y-axis direction, and is connected at the other end to a via VL6B. The plate electrode PL6B is connected to one end of a band-shaped plate electrode PL6C provided to the dielectric layer LY7, with the via VL6B interposed therebetween. The plate electrode PL6C is connected at the other end to a via VL6C. The plate electrode PL6C is connected to the capacitor electrode PC8 provided to the dielectric layer LY12, and a plate electrode PA2 provided to the dielectric layer LY16, with the via VL6C interposed therebetween. The plate electrode PA2 is connected to the second terminal T2 provided to the dielectric layer LY17, with a via V2 interposed therebetween. The plate electrodes PA2 and PL6 to PL6C and the vias VL6 to VL6C define the inductor L24 in FIG. 2.

As described above, FIG. 5 is a plan view where the dielectric layers LY2 to LY8 of the filter device 100 are overlapped with each other. As described with reference to FIGS. 3 and 4, in the filter device 100, the filter FLT1 which is the low pass filter is disposed on the left side (X-axis negative direction) side of the body 110 in FIG. 5, and the filter FLT2 which is the high pass filter is disposed on the right side (X-axis positive direction) side in FIG. 5. The inductors L11 and L12 of the filter FLT1 are disposed in a range RG1 (first range) of the body 110. The inductors L21 to L24 of the filter FLT2 are disposed in a range RG2 (second range) of the body 110.

As described with reference to FIGS. 3 and 4, the inductors L11 and L12 of the filter FLT1 are configured as vertical coils including the plate electrodes and the vias. The winding axes of the inductors L11 and L12 are in the Y-axis direction, and the inductors L11 and L12 are each wound two or more turns to secure a desired inductance. The inductor L11 is wound in a counter-clockwise (CCW) direction toward the Y-axis positive direction, and the inductor L12 is wound in a clockwise (CW) direction toward the Y-axis positive direction. Therefore, the inductors L11 and L12 generate magnetic fields in the Y-axis direction.

In the connected state between the inductors L11 and L12 as described with reference to FIG. 4, when a signal is transmitted from the antenna terminal TA to the first terminal T1 through the filter FLT1, the signal passes the inductor L11 in a direction indicated by an arrow AR1, and the signal passes the inductor L12 in a direction indicated by an arrow AR2. Therefore, a direction of the magnetic field caused by the inductor L11 becomes opposite from a direction of the magnetic field caused by the inductor L12. Thus, the filter FLT1 reduces or prevents magnetic coupling between the inductors.

In the filter FLT2, the inductors L21, L22, and L23 are helical coils in which planar coils having winding axes in the layered direction (Z-axis direction) of the body 110 are connected by the vias. Further, the inductor L24 is a vertical coil having a winding axis in the X-axis direction. Therefore, the inductors L21, L22, and L23 generate magnetic fields in the Z-axis direction, and the inductor L24 generates a magnetic field in the X-axis direction. The inductors L21 and L23 disposed facing the filter FLT1 are each wound two or more turns.

In the filter device 100 according to Preferred Embodiment 1, as seen in plan view in the layered direction of the body 110, the direction of the magnetic field caused by the filter FLT1 is perpendicular or substantially perpendicular to the magnetic field caused by the filter FLT2, and the magnetic field of each filter does not face the coil of the other filter. In other words, an imaginary line CL1 drawn from an extending-direction center of the plate electrode of the inductor of the filter FLT1 in a direction perpendicular or substantially perpendicular to the extending direction does not intersect with the inductors L21 to L24 of the filter FLT2. An angle between the extending direction of the imaginary line CL1 (second direction) and a direction from the range RG1 to the range RG2 (first direction) is about 90°, for example.

In such a configuration, in the filter device 100, the magnetic field caused by the filter FLT1 does not interfere with the magnetic fields caused by the inductors L21 and L23 of the filter FLT2 which are disposed at the position facing the range RG1. As a result, magnetic coupling between the inductors of the filter FLT1 and the filter FLT2 can be reduced or prevented.

Bandpass Characteristics

Figure 6:
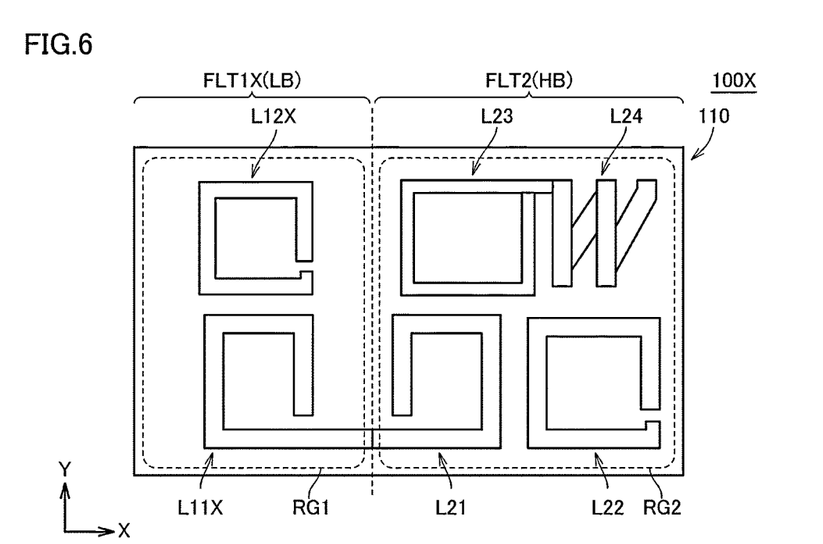
FIG. 6 is a diagram illustrating layout of inductors in each filter in a filter device according to Comparative Example 1.

Next, bandpass characteristics of the filter device 100 according to Preferred Embodiment 1 are described with reference to a comparative example. FIG. 6 is a diagram illustrating layout of inductors in each filter in a filter device 100X according to Comparative Example 1. In the filter device 100X, inductors L11X and L12X included in a filter FLT1X on the low band side include planar coils having winding axes in the Z-axis direction. The high band side is similar to the filter FLT2 in Preferred Embodiment 1. In the case of the filter device 100X, magnetic fields caused by the inductors L11X and L12X of the filter FLT1X interfere with the magnetic fields caused by the inductors L21 and L23 of the filter FLT2 which are disposed at the position facing the range RG1. Thus, magnetic coupling between the inductors may be caused.

Figure 7:
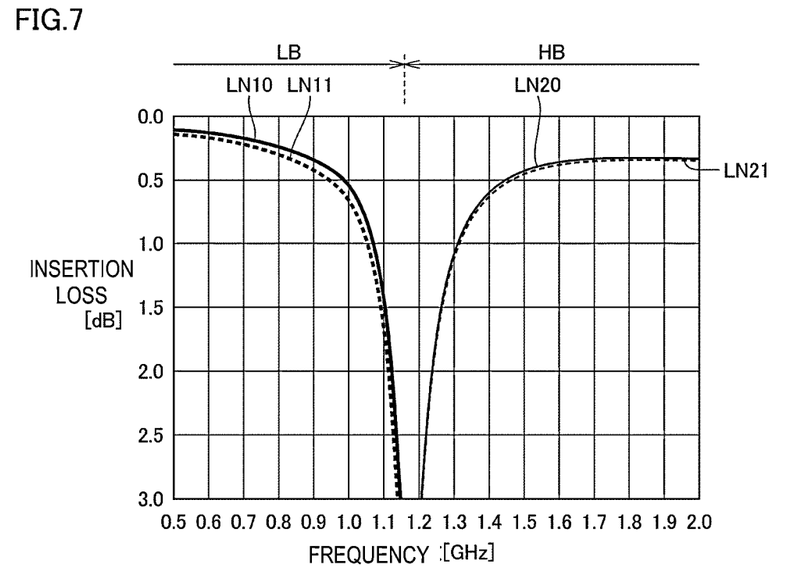
FIG. 7 is a diagram illustrating bandpass characteristics of the filter devices according to Preferred Embodiment 1 of the present invention and Comparative Example 1.

FIG. 7 is a diagram illustrating the bandpass characteristics of the filter device 100 according to Preferred Embodiment 1 and the filter device 100X according to Comparative Example 1. In FIG. 7, a horizontal axis indicates a frequency and a vertical axis indicates an insertion loss. In FIG. 7, solid lines LN10 and LN20 indicate respective insertion losses of the filters FLT1 and FLT2 of the filter device 100 in Preferred Embodiment 1. Further, broken lines LN11 and LN21 indicate respective insertion losses of the filters FLT1X and FLT2 of the filter device 100X in Comparative Example 1.

As illustrated in FIG. 7, on the low band side, a Q factor of the inductor is improved as a result of suppression of the magnetic coupling, and thus the insertion loss of the filter device 100 in Preferred Embodiment 1 is improved compared to the case of the filter device 100X in Comparative Example 1. Note that, as indicated by the equivalent circuit in FIG. 2, the inductor L11 on the low band side is an element which can directly be seen also from the filter FLT2 on the high band side. Therefore, although the filter device 100 and the filter device 100X have the same configuration in terms of the high band side, the improvement in the Q factor of the inductor L11 on the low band side leads also to slight improvement in the insertion loss of the filter FLT2 on the high band side in the filter device 100 of Preferred Embodiment 1 compared to the filter device 100X of Comparative Example 1.

Figure 8:
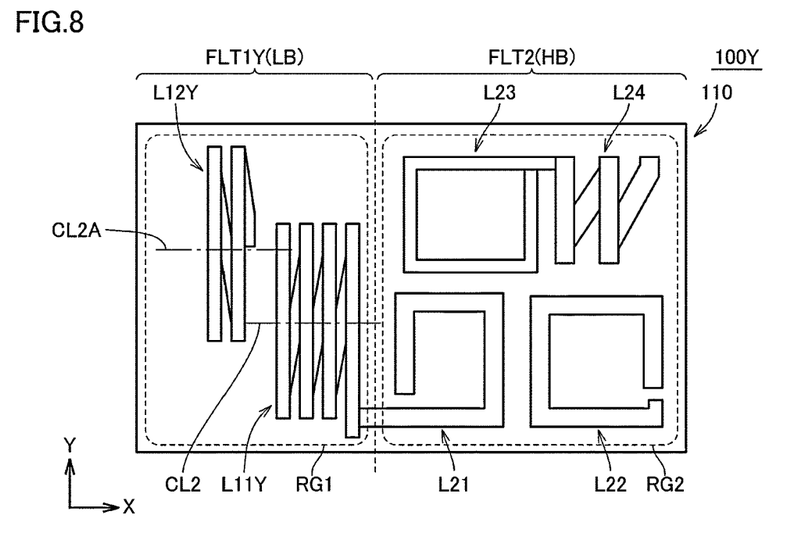
FIG. 8 is a diagram illustrating layout of inductors in each filter in a filter device according to Comparative Example 2.

Further, FIG. 8 is a diagram illustrating layout of inductors in each filter in a filter device 100Y according to Comparative Example 2 having different configuration. In the filter device 100Y, each of inductors L11Y and L12Y included in a filter FLT1Y on the low band side is a vertical coil similarly to the filter device 100 in Preferred Embodiment 1. However, the inductors L11Y and L12Y are disposed to have winding axes in the X-axis direction. That is, an angle between the direction from the range RG1 to the range RG2 and imaginary lines CL2 and CL2A drawn from extending-direction centers of the plate electrodes of the inductors L11Y and L12Y in a direction perpendicular or substantially perpendicular to the extending direction is 0°, for example.

Therefore, the direction of the magnetic field caused by each of the inductors L11Y and L12Y is the direction of the filter FLT2. Thus, the magnetic fields caused by the inductors L11Y and L12Y of the filter FLT1Y interfere with the magnetic fields caused by the inductors L21 and L23 of the filter FLT2 which are disposed at the position facing the range RG1. As a result, magnetic coupling between the inductors may be caused.

Figure 9:
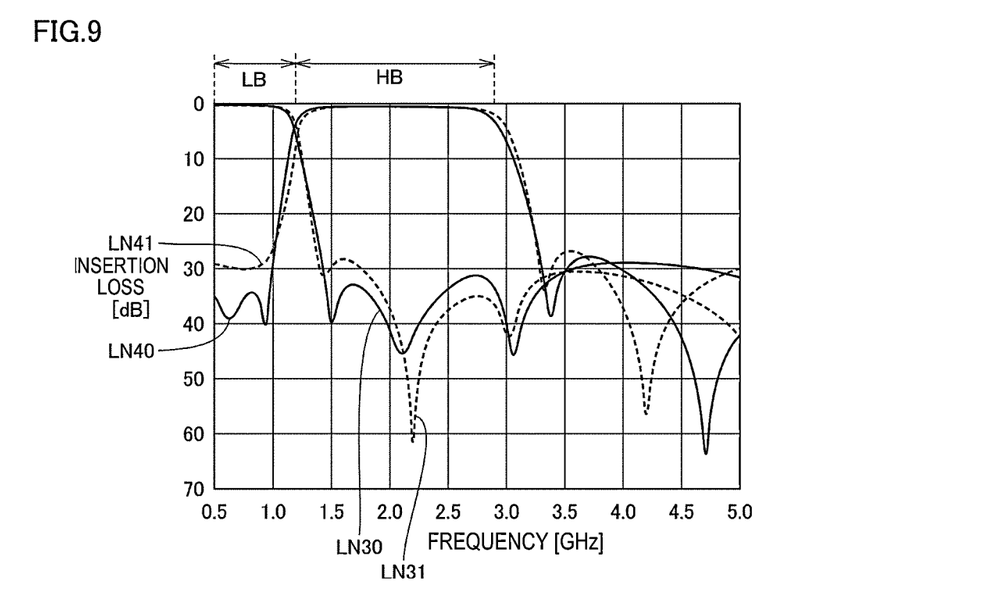
FIG. 9 is a diagram illustrating bandpass characteristics of the filter devices according to Preferred Embodiment 1 of the present invention and Comparative Example 2.

FIG. 9 is a diagram illustrating the bandpass characteristics of the filter device 100 according to Preferred Embodiment 1 and the filter device 100Y according to Comparative Example 2. In FIG. 9, a horizontal axis indicates a frequency and a vertical axis indicates an insertion loss. In FIG. 9, solid lines LN30 and LN40 indicate respective insertion losses of the filters FLT1 and FLT2 of the filter device 100 in Preferred Embodiment 1. Further, broken lines LN31 and LN41 indicate respective insertion losses of the filters FLT1Y and FLT2 of the filter device 100Y in Comparative Example 2.

As illustrated in FIG. 9, the insertion losses in the pass bands on the low band side and the high band side are substantially the same between the filter device 100 and the filter device 100Y. However, in the filter device 100Y of Comparative Example 2, since the inductors magnetically couple to each other, attenuation at an attenuation pole around the pass band (around 1.5 GHz) on the low band side and attenuation at an attenuation pole around the pass band (around 1.0 GHz) on the high band side become smaller. In other words, in the filter device 100 according to Preferred Embodiment 1, attenuation characteristics in the non-pass band are improved compared to the case of the filter device 100Y according to Comparative Example 2.

As described above, in the filter device (diplexer) provided with two filters having different pass bands, the inductor of the filter on the low band side is including a vertical coil, in the filter on the high band side, the inductor disposed facing the filter on the low band side is including a planar coil, and the inductor on the low band side is disposed such that the inductor on the low band side and the inductor on the high band side do not magnetically couple to each other, thus reducing or preventing deterioration in filter characteristics.

Note that, in the above description, the inductor on the low band side is configured as the vertical coil, and the inductor on the high band side facing the filter on the low band side is configured as the planar coil. However, conversely, the inductor on the low band side may be including a planar coil, and the inductor on the high band side may be including a vertical coil.

Further, although in the above description the filter on the low band side includes two inductors, the number of inductors included in the filter on the low band side may be three or more.

The "filter FLT1" and the "filter FLT2" in Preferred Embodiment 1 correspond to a "first LC filter" and a "second LC filter", respectively. The "inductor L11" and the "inductor L12" in Preferred Embodiment 1 correspond to a "first inductor" and a "second inductor", respectively.

Preferred Embodiment 2

In Preferred Embodiment 1, the case in which the winding axis of the inductor included in the filter FLT1 on the low band side is in the Y-axis direction is described. That is, the angle between the direction from the filter FLT1 to the filter FLT2 (first direction) and the direction of the winding axis of the inductor of the filter FLT1 (second direction) is about 90°, for example. However, the angle between the first direction and the second direction need not necessarily be about 90°.

Figure 10:
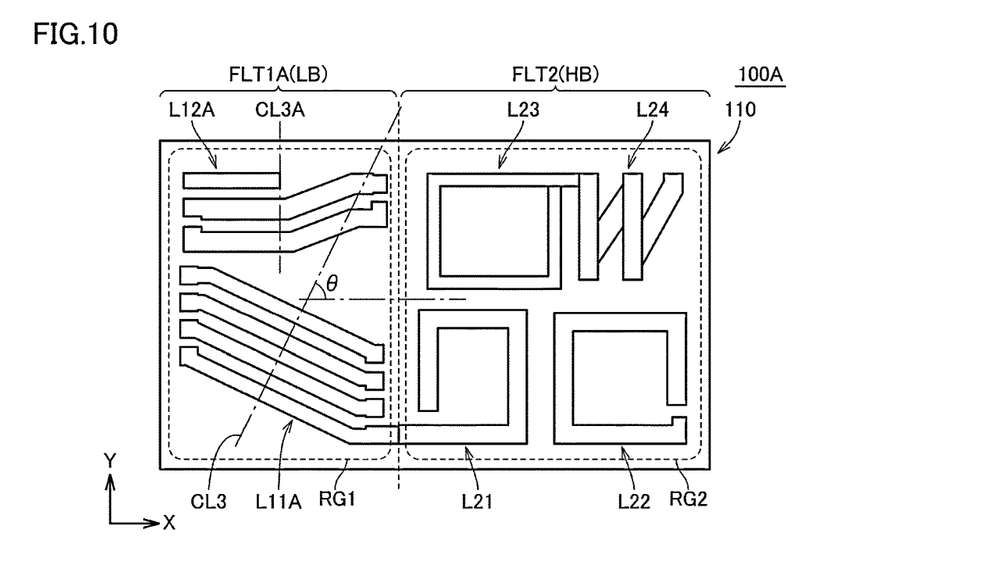
FIG. 10 is a diagram illustrating layout of inductors in each filter in a filter device according to Preferred Embodiment 2 of the present invention.

FIG. 10 is a diagram illustrating layout of inductors in each filter in a filter device 100A according to Preferred Embodiment 2. The filter device 100A has a configuration in which the filter FLT1 on the low band side in Preferred Embodiment 1 is replaced by a filter FLT1A. Note that the filter FLT2 on the high band side is similar to that of the filter device 100. Redundant description for components in the filter device 100A similar to those in the filter device 100 is not repeated.

With reference to FIG. 10, the filter FLT1A on the low band side includes inductors L11A and L12A configured as vertical coils. The inductor L11A is disposed such that, as seen in plan view in the layered direction of the body 110, an imaginary line CL3 drawn from an extending-direction center of the plate electrode in a direction perpendicular or substantially perpendicular to the extending direction is inclined with respect to the Y-axis direction. More specifically, the inductor L11A is disposed such that an angle θ between the direction of the imaginary line CL3 (that is, the direction of the winding axis) and the direction from the range RG1 to the range RG2 is about 45° or larger and about 90° or smaller (45°≤θ≤90°, for example. Here, the imaginary line CL3 does not intersect with the inductors L21 to L24 included in the filter FLT2. Note that the inductor L12A is disposed such that an imaginary line CL3A extends in the Y-axis direction.

As described above, also in the configuration in which the winding axis of the inductor of the vertical coil on the low band side is disposed so as to be inclined, by the configuration in which the inductor on the high band side configured as the planar coil is not disposed in the direction of the magnetic field caused by the inductor on the low band side, magnetic coupling between the inductor on the low band side and the inductor on the high band side can be reduced or prevented. As a result, deterioration in filter characteristics in the diplexer can be reduced or prevented.

Preferred Embodiment 3

In Preferred Embodiments 1 and 2, in the filter FLT2 on the high band side, all the inductors facing the range RG1 on the low band side are planar coils. In Preferred Embodiment 3, configuration in which the inductor of the filter on the high band side facing the range RG1 on the low band side includes a vertical coil is described.

Figure 11:
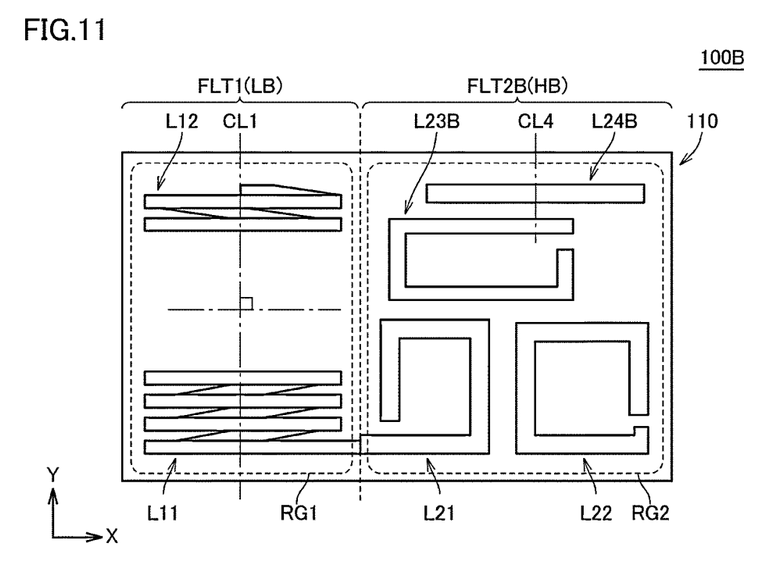
FIG. 11 is a diagram illustrating layout of inductors in each filter in a filter device according to Preferred Embodiment 3 of the present invention.

FIG. 11 is a diagram illustrating layout of inductors in each filter in a filter device 100B according to Preferred Embodiment 3. The filter device 100B has a configuration in which the filter FLT2 on the high band side in Preferred Embodiment 1 is replaced by a filter FLT2B. Note that the filter FLT1 on the low band side is similar to that of the filter device 100. Redundant description for components in the filter device 100B similar to those in the filter device 100 is not repeated.

With reference to FIG. 11, in the filter FLT2B on the high band side, the inductors L23 and L24 of the filter FLT2 of the filter device 100 are replaced by inductors L23B and L24B. The inductor L23B is a planar coil and is disposed to adjacent to the inductors L21 and L22 in the Y-axis positive direction and facing the range RG1. The inductor L24B is a vertical coil including a plate electrode extending in the X-axis direction and a via extending in the layered direction of the body 110. A direction of a winding axis of the inductor L24B is the Y-axis direction. The inductor L24B is disposed adjacent to the inductor L23B in the Y-axis position direction. In other words, the inductor L23B is disposed between the inductor L21 and the inductor L24B.

An end portion of the inductor L24B in the X-axis negative direction faces the range RG1 of the filter FLT1 on the low band side. However, a distance between the inductor L24B and the range RG1 is longer than a distance between the inductor L21 and the range RG1 and a distance between the inductor L23B and the range RG1. Note that the distance between the inductor L24B on the high band side and the inductors L11 and L12 on the low band side is desirably about 50 µm or longer, for example.

In the filter FLT1, the imaginary line CL1 drawn from the extending-direction center of the plate electrodes of the inductors L11 and L12 which are vertical coils in the direction perpendicular or substantially perpendicular to the extending direction does not intersect with the inductors L21, L22, L23B, and L24B of the filter FLT2B. Further, in the filter FLT2B, an imaginary line CL4 drawn from an extending-direction center of the plate electrode of the inductor L24B which is a vertical coil in a direction perpendicular or substantially perpendicular to the extending direction does not intersect with the inductors L11 and L12.

In such layout of the inductors L11 and L12 in the filter FLT1, a magnetic field caused by the filter FLT1 does not interfere with magnetic fields caused by the inductors L21 and L23B of the filter FLT2B which are disposed at the position facing the range RG1. Further, the inductor L24B which is the vertical coil of the filter FLT2B is disposed to be farther than the inductors L21 and L23B with respect to the range RG1. Thus, interference between a magnetic field caused by the inductor L24B and the magnetic fields caused by the inductors L11 and L12 of the filter FLT1 can be reduced or prevented.

As described above, also in the configuration of the filter FLT2B in which the inductor L24B configured as the vertical coil is disposed at the position facing the range RG1 of the filter FLT1, by the inductor L24B being disposed farther, with respect to the range RG1, than the inductors L21 and 23B which are planar coils, magnetic coupling between the vertical coils is reduced or prevented. As a result, decrease in isolation between the filters FLT1 and FLT2B can be reduced or prevented.

Moreover, it is generally known that an inductance value of a coil is in proportion to an air core diameter of the coil and is in inverse proportion to a length of the coil. Therefore, when achieving the same inductance value, by increasing the air core diameter like the inductor L24B compared to the inductor L24 in Preferred Embodiment 1, the entire line length of the inductor can be reduced. As a result, conductor loss of the inductor L24B is reduced, which leads to decrease in insertion loss of the filter FLT2B.

Therefore, in the configuration like the filter device 100B in Preferred Embodiment 3, deterioration in filter characteristics of the diplexer can be reduced or prevented.

Note that, in the filter device 100B in FIG. 11, the case is described in which the inductors L11 and L12 of the filter FLT1 and the inductor L24B of the filter FLT2B are configured as vertical coils having winding axes in the Y-axis direction. However, as long as the imaginary line drawn from the extending-direction center of the plate electrode of the vertical coil in the direction perpendicular or substantially perpendicular to the extending direction does not intersect with the inductor of the other filter, the inductors L11, 112, and L24B may be disposed such that their winding axes incline with respect to the Y-axis direction, like the inductor L11A of the filter device 100A in Preferred Embodiment 2.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A filter device comprising:
a body;
a first filter with a first pass band; and
a second filter with a second pass band different from the first pass band; wherein
as seen in plan view in a normal direction of the body, an inductor included in the first filter is in a first range, and an inductor included in the second filter is in a second range adjacent to the first range;
each of the first filter and the second filter includes at least one inductor;
the at least one inductor included in the first filter is a vertical coil which includes a plate electrode and a via extending in the normal direction of the body;
in the second filter, the at least one inductor facing the first range is a planar coil with a winding axis extending in the normal direction of the body; and
as seen in plan view in the normal direction of the body, an imaginary line does not intersect with the at least one inductor included in the second filter, the imaginary line being drawn from an extending-direction center of the plate electrode of the first filter in a direction perpendicular or substantially perpendicular to the extending direction.

2. The filter device according to claim 1, wherein an angle between a first direction from the first range to the second range and a second direction in which the imaginary line extends is substantially 45° or larger and substantially 90° or smaller.

3. The filter device according to claim 2, wherein the first direction is perpendicular or substantially perpendicular to the second direction.

4. The filter device according to claim 1, wherein the at least one inductor included in the first filter is wound two or more turns.

5. The filter device according to claim 1, wherein
the first filter includes a first inductor and a second inductor connected in series between an input terminal and an output terminal; and
each of the first inductor and the second inductor is defined by the vertical coil.

6. The filter device according to claim 5, wherein a direction of a magnetic field caused by the first inductor is different from a direction of a magnetic field caused by the second inductor.

7. The filter device according to claim 6, wherein the direction of the magnetic field caused by the first inductor is opposite from the direction of the magnetic field caused by the second inductor.

8. The filter device according to claim 1, wherein the pass band of the first filter is lower than the pass band of the second filter.

9. The filter device according to claim 1, wherein the filter device is a diplexer.

10. A high-frequency front end circuit comprising:
the filter device according to claim 1.

11. A filter device comprising:
a body;
a first filter with a first pass band; and
a second filter with a second pass band different from the first pass band; wherein
each of the first filter and the second filter includes at least one inductor;
as seen in plan view in a normal direction of the body, the at least one inductor included in the first filter is in a first range, and the at least one inductor included in the second filter is in a second range adjacent to the first range;
the at least one inductor included in the first filter is a vertical coil which includes a plate electrode and a via extending in the normal direction of the body;
in the second filter, the at least one inductor facing the first range includes a vertical coil and a planar coil with a winding axis extending in the normal direction of the body;
a distance between the vertical coil of the second filter and the first range is longer than a distance between the planar coil and the first range; and
as seen in plan view in the normal direction of the body:
a first imaginary line does not intersect with the at least one inductor included in the second filter, the first imaginary line being drawn from an extending-direction center of the plate electrode of the first filter in a direction perpendicular or substantially perpendicular to the extending direction; and
a second imaginary line does not intersect with the at least one inductor included in the first filter, the second imaginary line being drawn from an extending-direction center of the plate electrode of the second filter in a direction perpendicular or substantially perpendicular to the extending direction.

12. The filter device according to claim 11, wherein an angle between a first direction from the first range to the second range and a second direction in which the imaginary line extends is substantially 45° or larger and substantially 90° or smaller.

13. The filter device according to claim 12, wherein the first direction is perpendicular or substantially perpendicular to the second direction.

14. The filter device according to claim 11, wherein the at least one inductor included in the first filter is wound two or more turns.

15. The filter device according to claim 11, wherein
the first filter includes a first inductor and a second inductor connected in series between an input terminal and an output terminal; and
each of the first inductor and the second inductor is defined by the vertical coil.

16. The filter device according to claim 15, wherein a direction of a magnetic field caused by the first inductor is different from a direction of a magnetic field caused by the second inductor.

17. The filter device according to claim 16, wherein the direction of the magnetic field caused by the first inductor is opposite from the direction of the magnetic field caused by the second inductor.

18. The filter device according to claim 11, wherein the pass band of the first filter is lower than the pass band of the second filter.

19. The filter device according to claim 11, wherein the filter device is a diplexer.

20. A high-frequency front end circuit comprising:
the filter device according to claim 11.

* * * * *